(12) United States Patent
Kim (10) Patent No.: US 10,706,908 B2
(45) Date of Patent: Jul. 7, 2020

(54) REFRESH CONTROL CIRCUIT, SEMICONDUCTOR MEMORY DEVICE, AND REFRESH METHOD THEREOF

(71) Applicant: SK hynix Inc., Gyeonggi-do (KR)

(72) Inventor: Do-Hong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/145,460

(22) Filed: Sep. 28, 2018

(65) Prior Publication Data

US 2019/0279706 A1 Sep. 12, 2019

(30) Foreign Application Priority Data

Mar. 7, 2018 (KR) ........................ 10-2018-0026946

(51) Int. Cl.
*G11C 11/34* (2006.01)
*G11C 11/406* (2006.01)
(Continued)

(52) U.S. Cl.
CPC .... *G11C 11/40618* (2013.01); *G11C 11/4072* (2013.01); *G11C 11/4085* (2013.01); *G11C 29/783* (2013.01); *G11C 29/787* (2013.01)

(58) Field of Classification Search
CPC .... G11C 11/40; G11C 2207/2227; G11C 5/14
(Continued)

(56) References Cited

U.S. PATENT DOCUMENTS

2010/0153775 A1* 6/2010 Sugawara ............ G11C 29/789
714/6.13
2015/0162067 A1* 6/2015 Kim ...................... G11C 11/406
365/222

(Continued)

FOREIGN PATENT DOCUMENTS

KR 1020150067787 6/2015
KR 1020160011483 2/2016

*Primary Examiner* — Huan Hoang
(74) *Attorney, Agent, or Firm* — IP & T Group LLP (57) ABSTRACT

A semiconductor memory device includes: first to $N^{th}$ memory banks each including a normal cell region coupled to normal word lines and a redundant cell region coupled to redundant word lines; first to $N^{th}$ non-volatile memories that correspond to the first to $N^{th}$ memory banks, respectively, each including a plurality of memory sets for programming repair addresses of the corresponding memory banks; a refresh control circuit for generating first to $N^{th}$ count values by counting a number of the memory sets used in the first to $N^{th}$ non-volatile memories, and generating a redundant reset signal based on the first to $N^{th}$ count values; and an address generation circuit for sequentially generating normal addresses for selecting the normal word lines and redundant addresses for selecting the redundant word lines based on a refresh signal, and initializing the redundant addresses based on the redundant reset signal.

18 Claims, 8 Drawing Sheets

(51) Int. Cl.
*G11C 29/00* (2006.01)
*G11C 11/4072* (2006.01)
*G11C 11/408* (2006.01)

(58) Field of Classification Search
USPC .......................................................... 365/174
See application file for complete search history.

(56) References Cited

U.S. PATENT DOCUMENTS

2017/0256326 A1* 9/2017 You ..................... G06F 11/0727
2018/0336954 A1* 11/2018 Yeh .................... G11C 16/3445

* cited by examiner

CUT

REFRESH CONTROL CIRCUIT, SEMICONDUCTOR MEMORY DEVICE, AND REFRESH METHOD THEREOF

CROSS-REFERENCE TO RELATED APPLICATIONS

The present application claims priority under 35 U.S.C. § 119(a) to Korean Patent Application No. 10-2018-0026946, filed on Mar. 7, 2018, which is incorporated herein by reference in its entirety.

BACKGROUND

1. Field

Exemplary embodiments of the present invention relate to a semiconductor technology, and more particularly, to a semiconductor memory device that performs a refresh operation.

2. Description of the Related Art

Generally, a semiconductor memory device may include a plurality of memory banks for storing data. Each of the memory banks may include tens of millions of memory cells including a cell capacitor and a cell transistor. The semiconductor memory device may store data by charging or discharging the cell capacitor.

Ideally, the charges stored in the cell capacitor should remain constant if there is no control applied. However, in reality, the charges stored in the cell capacitor may change due to a voltage difference between the voltage of the capacitor and the voltage of a peripheral circuit. As a result, stored charges may be gradually leaked or discharged from the cell capacitor. Also, when the cell capacitor is in a discharged state, some charges may be leaked from the cell capacitor. These changes in the charges stored in the cell capacitor means that the data stored in the cell capacitor may be lost. For preventing data loss, a semiconductor memory device is subjected to a periodic refresh operation. However, a refresh operation may significantly increase the operational load of a memory device. Hence, improvements in this regard are highly desirable.

SUMMARY

Embodiments of the present invention are directed to a refresh control circuit, a refresh method, and a semiconductor memory device, employing the same. The refresh control circuit may perform a refresh operation only onto a redundant word line which is used for repairing a repair target word line.

In accordance with an embodiment of the present invention, a semiconductor memory device includes: first to $N^{th}$ memory banks each including a normal cell region coupled to normal word lines and a redundant cell region coupled to redundant word lines; first to $N^{th}$ non-volatile memories that correspond to the first to $N^{th}$ memory banks, respectively, each including a plurality of memory sets for programming repair addresses of the corresponding memory banks; a refresh control circuit suitable for generating first to $N^{th}$ count values by counting a number of the memory sets used in the first to $N^{th}$ non-volatile memories, and generating a redundant reset signal based on the first to $N^{th}$ count values; and an address generation circuit suitable for sequentially generating normal addresses for selecting the normal word lines and redundant addresses for selecting the redundant word lines based on a refresh signal, and initializing the redundant addresses based on the redundant reset signal.

In accordance with an embodiment of the present invention a refresh control circuit includes: a plurality of fuse circuits each including a plurality of fuse sets for programming repair addresses of a corresponding memory bank among a plurality of memory banks; a plurality of counting units suitable for generating a plurality of count values by counting the number of fuse sets that are used in each fuse circuit; a counting detection unit suitable for detecting a maximum value among the count values and outputting a detection signal; an address generation circuit suitable for sequentially generating redundant addresses for selecting redundant word lines based on a refresh signal, and initializing the redundant addresses based on a redundant reset signal; and a reset signal generation unit suitable for generating the redundant reset signal based on the detection signal and the redundant address.

In accordance with an embodiment of the present invention, a method for refreshing a semiconductor memory device includes: providing first to $N^{th}$ memory banks and first to $N^{th}$ non-volatile memories each including a plurality of memory sets for programming repair addresses of the corresponding memory banks includes: generating first to $N^{th}$ count values by counting a number of the memory sets used in the first to $N^{th}$ non-volatile memories; generating a redundant reset signal based on a maximum value among the first to $N^{th}$ count values; and sequentially generating normal addresses for selecting normal word lines and redundant addresses for selecting redundant word lines based on a refresh signal, and initializing the redundant addresses based on the redundant reset signal.

In accordance with an embodiment of the present invention, a semiconductor memory device includes: a plurality of memory banks, each including a normal cell region coupled to normal word lines and a redundant cell region coupled to redundant word lines; a plurality of non-volatile memories, each of the plurality of non-volatile memory corresponding to each of the plurality of memory banks and including a plurality of repair addresses for the redundant cell region; a refresh control circuit suitable for generating a redundant reset signal by counting a number of the repair address; and a refresh circuit suitable for sequentially generating redundant addresses for refreshing the redundant cell region based on a refresh signal and initializing the redundant addresses based on the redundant reset signal.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

As semiconductor fabrication technology advances, the degree of integration of semiconductor memory devices is gradually increasing, and the number of cells to be subjected to a refresh operation is also increasing. To reduce the time required for the refresh operation, a method of simultaneously performing a one-time refresh operation onto a plurality of cells is proposed. For example, a refresh operation may be performed simultaneously onto all the memory banks of a semiconductor device by simultaneously enabling respective memory bank selection signals for activating corresponding memory banks.

Meanwhile, each memory bank may be basically divided into a normal cell region where there are cells storing data and a redundant cell region where there are cells for saving defective cells in the normal cell region. A repair operation may replace a defective cell in the normal cell region with a cell in the redundant cell region. In the case of a semiconductor memory device in support of a repair operation, when performing a refresh operation, a redundant cell used for repairing a defective cell has to be refreshed instead of a defective cell. Accordingly, when a target address is inputted for each memory bank, it is determined whether the memory cell corresponding to the target address is included in the redundant cell region or the normal cell region, and the refresh operation may be performed onto the cell in the corresponding area.

Meanwhile, the refresh operation may be sequentially performed onto all the redundant word lines in the semiconductor memory device at any given time, regardless of whether a word line of the redundant cell region of each memory bank (hereinafter, referred to as 'a redundant word line') is used for repair or not. Hereinafter, an embodiment of the present invention is directed to a method for improving a refresh efficiency by performing a refresh operation only onto the redundant word lines that are used for repair.

Hereinafter, only essential constituent elements related to a refresh operation and a row repair operation performed in accordance with an embodiment of the present invention are described in order to fully explain the points of the present invention.

Figure 1:
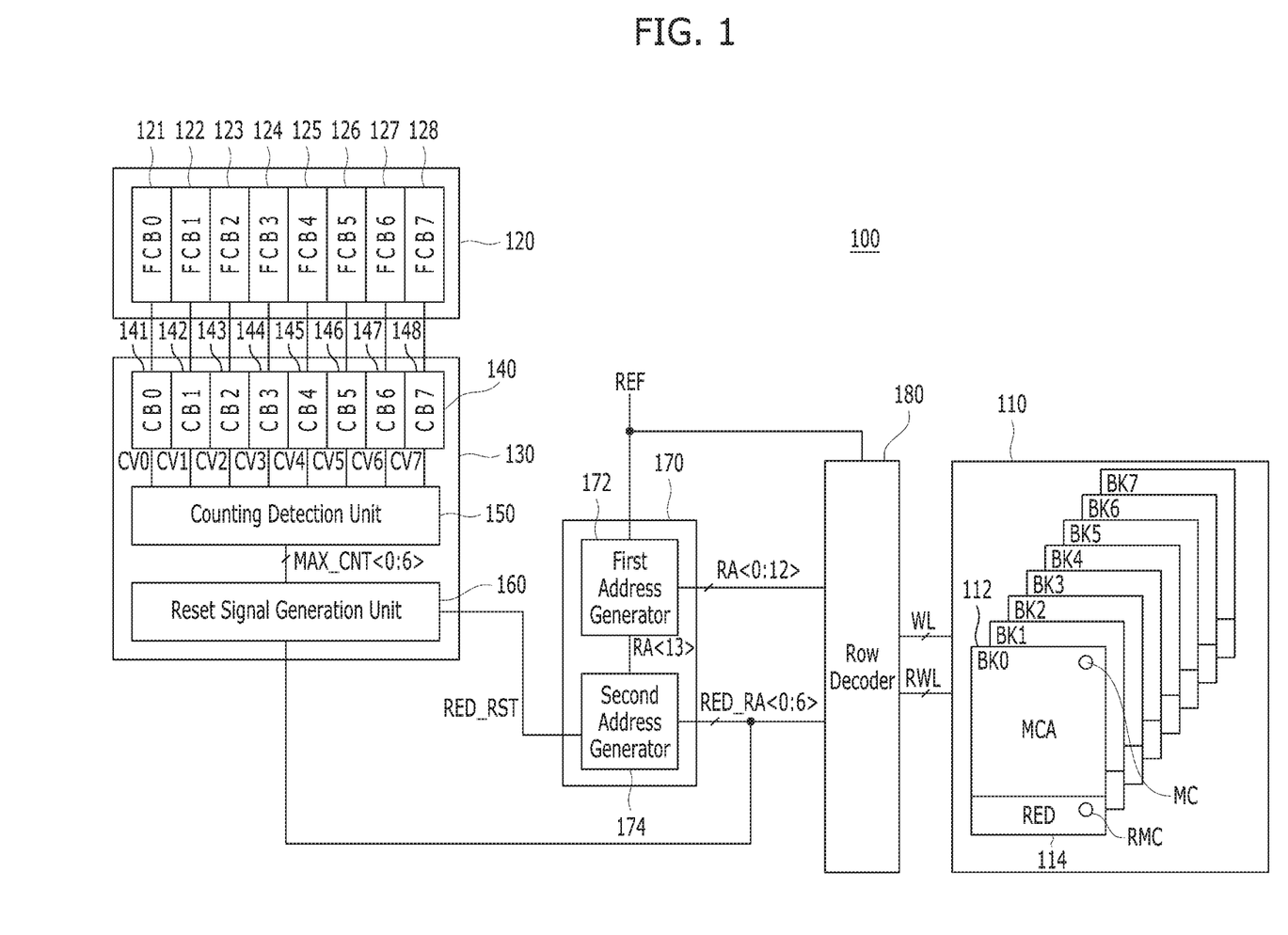
FIG. 1 is a block diagram illustrating a semiconductor memory device in accordance with an embodiment of the present invention.

FIG. 1 is a block diagram illustrating a semiconductor memory device 100 in accordance with an embodiment of the present invention.

Referring to FIG. 1, the semiconductor memory device 100 may include a memory array region 110, a nonvolatile memory 120, a refresh control circuit 130, an address generation circuit 170, and a row decoder 180.

The memory array region 110 may include a plurality of memory banks, for example, first to $N^{th}$ memory banks. Each of the first to $N^{th}$ memory banks may include a normal cell region 112 coupled to normal word lines WL and a redundant cell region 114 coupled to redundant word lines RWL. FIG. 1 shows a case where the memory array region 110 includes eight memory banks, that is, first to eighth memory banks BK0 to BK7.

Figure 2:
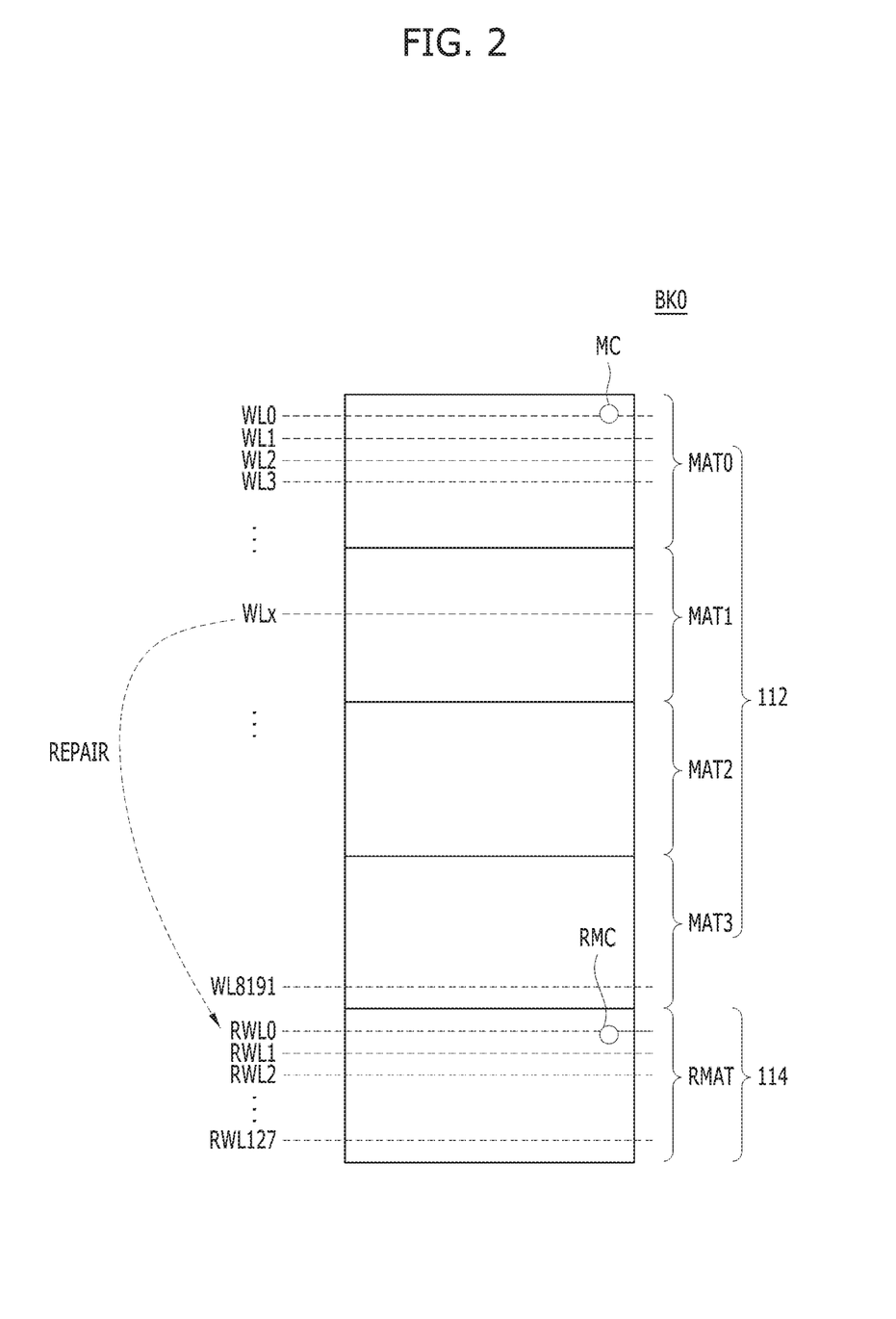
FIG. 2 illustrates a first memory bank shown in FIG. 1.

FIG. 2 illustrates a first memory bank in accordance with an embodiment of the present invention, for example, the first memory bank BK0 shown in FIG. 1. The second to eighth memory banks BK1 to BK7 may have substantially the same structure as the first memory bank BK0.

Referring to FIG. 2, the first memory bank BK0 may include the normal cell region 112 including a plurality of normal cell matrices (for example, first to fourth normal cell matrices MAT0 to MAT3) and the redundant cell region 114 including at least one redundant cell matrix RMAT. FIG. 2 shows a case where 8K (i.e., 8192) normal word lines WL and 128 redundant word lines RWL are coupled to the normal cell region 112 and the redundant cell region 114, respectively. In other words, the first to fourth normal cell matrices MAT0 to MAT3 may be coupled to the 8192 normal word lines WL0 to WL8191, and the redundant cell matrix RMAT may be coupled to the 128 redundant word lines RWL0 to RWL127.

A plurality of normal cells MC positioned at the respective intersections between the normal word lines WL and bit lines (not shown) may be arranged in the normal cell region 112. A plurality of redundant cells RMC positioned at the respective intersections between the redundant word lines RWL and the bit lines (not shown) may be arranged in the redundant cell region 114. When a defective cell (i.e., a repair target cell) is detected in the normal cell region 112, a normal word line (i.e., a repair target word line) where the repair target cell is positioned may be replaced with a redundant word line of the redundant cell region 114. For example, a repair target cell is detected in the normal word line WLx, the normal word line WLx becomes a repair target word line and may be replaced with the redundant word line RWL0 of the redundant cell region 114. In the illustrated example, a 13-bit normal address RA<0:12> may be required to designate 8K normal word lines WL, and a 7-bit redundant address RED_RA<0:6> may be required to designate 128 redundant word lines RWL.

Referring back to FIG. 1, the non-volatile memory 120 may include a non-volatile memory such as an array e-fuse (ARE) circuit, a laser fuse circuit, a NAND flash memory, a NOR flash memory, a Magnetic Random Access Memory (MRAM), a Spin Transfer Torque Magnetic Random Access Memory (STT-MRAM), a Resistive Random Access Memory (ReRAM), and a Phase Change Random Access Memory (PC RAM). Hereinafter, a case where the non-volatile memory 120 is a fuse circuit formed of a plurality of fuse cells will be described as an example.

The fuse circuit as the non-volatile memory 120 may include first to eighth fuse blocks 121 to 128 corresponding to the first to eighth memory banks BK0 to BK7, respectively. The first to eighth fuse blocks 121 to 128 may include a plurality of memory sets (i.e., fuse sets) for programming an address (hereinafter referred to as 'a repair address') of a repair target word line of a corresponding memory bank, respectively.

Figure 3:
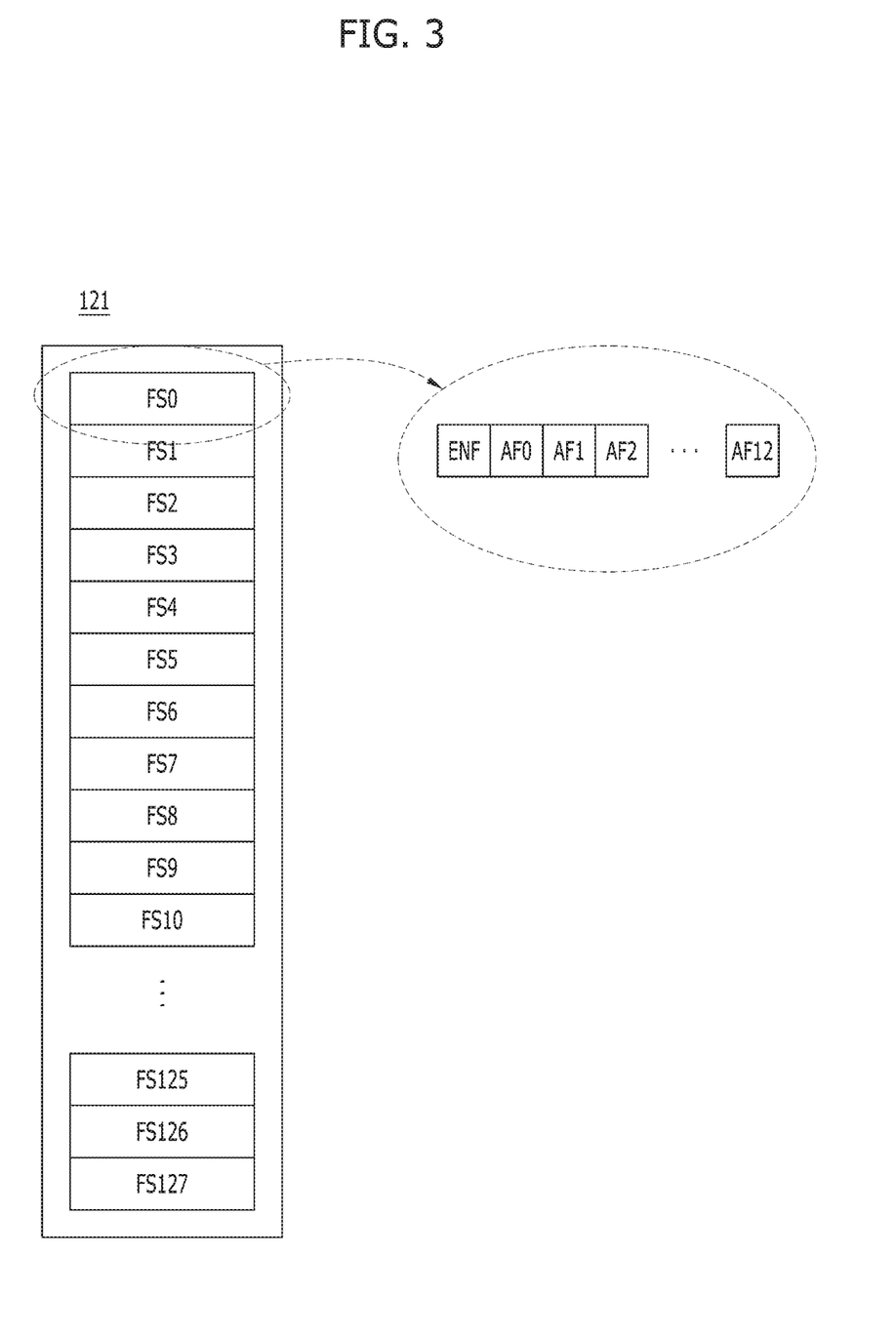
FIG. 3 illustrates a fuse block shown in FIG. 1.

FIG. 3 illustrates a fuse block in accordance with an embodiment of the present invention, for example, the first fuse block 121 shown in FIG. 1. The second to eighth fuse blocks 122 to 128 may have substantially the same structure as the first fuse block 121.

Referring to FIG. 3, the first fuse block 121 may include a plurality of fuse sets for programming a repair address of the first memory bank BK0. For example, the first fuse block 121 may include first to 128$^{th}$ fuse sets FS0 to FS127 corresponding to the 128 redundant word lines RWL0 to RWL127, respectively.

Each fuse set may include an enable fuse ENF and a plurality of address fuses AF0 to AF12. The enable fuse ENF may program information about whether the corresponding fuse set is programming a valid repair address or not. The address fuses AF0 to AF12 may include a number of fuse cells for programming each bit of the repair address to program the repair address. For example, when a normal address of 13 bits RA<0:12> is formed, each of the fuse sets may be provided with first to 13$^{th}$ address fuses AF0 to AF12.

Referring back to FIG. 1, the refresh control circuit 130 may count the number of fuse sets used in the first to eighth fuse blocks 121 to 128 to generate the first to eighth count values CV0 to CV7, and generate a redundant reset signal RED_RST based on the first to eighth count values CV0 to CV7. In particular, the refresh control circuit 130 may generate the redundant reset signal RED_RST based on the maximum value among the first to eighth count values CV0 to CV7.

For example, the refresh control circuit 130 may include a counting unit 140, a counting detection unit 150, and a reset signal generation unit 160.

The counting unit 140 may include first to eighth counters 141 to 148 corresponding to the first to eighth fuse blocks 121 to 128, respectively. The first to eighth counters 141 to 148 may generate the first to eighth count values CV0 to CV7 by counting the number of fuse sets that are used in the corresponding fuse block, respectively. The first to eighth counters 141 to 148 may count the number of the programmed enabled fuses of the fuse sets (i.e., the number of cuts of the enable fuses) in the corresponding fuse block to generate the first to eighth count values CV0 to CV7.

The counting detection unit 150 may detect the maximum value among the first to eighth count values CV0 to CV7 and output a detection signal MAX_CNT<0:6>. For example, the counting detection unit 150 may output a 7-bit detection signal MAX_CNT<0:6>.

The reset signal generation unit 160 may generate the redundant reset signal RED_RST based on the detection signal MAX_CNT<0:6>. The reset signal generation unit 160 may activate and output the redundant reset signal RED_RST when the bits of the detection signal MAX_CNT<0:6> coincide with the bits of the redundant address RED_RA<0:6>.

The address generation circuit 170 may sequentially generate normal addresses RA<0:12> each of which is used for selecting a normal word line WL based on a refresh signal REF and a redundant address RED_RA<0:6> for selecting a redundant word line RWL, and may initialize the redundant address RED_RA<0:6> based on the redundant reset signal RED_RST.

For example, the address generation circuit 170 may include a first address generator 172 and a second address generator 174.

The first address generator 172 may generate the 13-bit normal addresses RA<0:12> that sequentially increase by counting the refresh signal REF. The first address generator 172 may be initialized, after the 13 bits of the normal address RA<0:12> reach the maximum value, that is, after all the bits of the normal address RA<0:12> are at a logic high level. For example, the first address generator 172 may count not the 13 bits of the normal address RA<0:12> but the 14 bits of the normal address RA<0:13>, and the first address generator 172 may be initialized in response to the 14$^{th}$ bit RA<13> of the normal address RA<0:13> being activated to a logic high level.

The second address generator 174 may be enabled based on the 14$^{th}$ bit RA<13> of the normal address RA<0:13>, count the refresh signal REF, and generate the redundant addresses RED_RA<0:6> that sequentially increase. The second address generator 174 may be initialized in response to the redundant reset signal RED_RST.

In response to the refresh signal REF, the row decoder 180 may activate a normal word line WL selected based on the normal address RA<0:12> or a redundant word line RWL selected based on the redundant address RED_RA<0:6>. Accordingly, a refresh operation may be performed.

Figure 4:
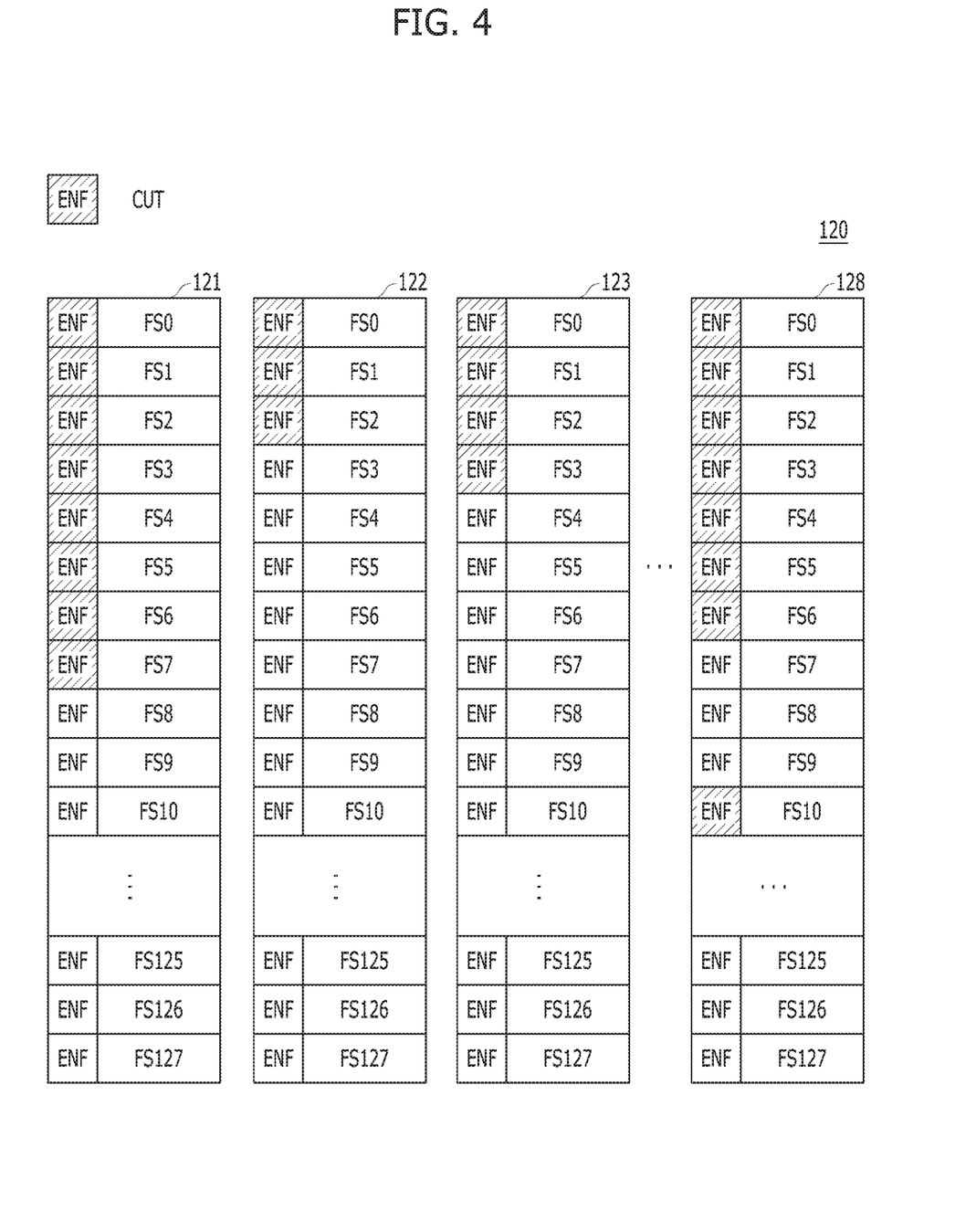
FIG. 4 illustrates a fuse circuit shown in FIG. 1.

FIG. 4 illustrates a fuse circuit in accordance with an embodiment of the present invention, for example, the fuse circuit 120 shown in FIG. 1.

Referring to FIG. 4, the first to eighth fuse blocks 121 to 128 may include 128 fuse sets FS0 to FS127 for programming the repair addresses of the first to eighth banks BK0 to BK7, respectively.

Each of 128 fuse sets FS0 to FS127 may include an enable fuse ENF and a plurality of address fuses (not shown). The enable fuse ENF may be cut out if the corresponding fuse set is programmed with a valid repair address.

For example, when the enable fuses ENF of the first to eighth fuse sets FS0 to FS7 are cut in the first fuse block 121, it may mean that a total of eight fuse sets are in use. In the second fuse block 122, when the enable fuses ENF of the first to third fuse sets FS0 to FS2 are cut, it may mean that a total of three fuse sets are in use. Likewise, when the enable fuses ENF of the first to eleventh fuse sets FS0 to FS10 are cut in the eighth fuse block 128, it may mean that a total of 11 fuse sets are in use.

Figure 5:
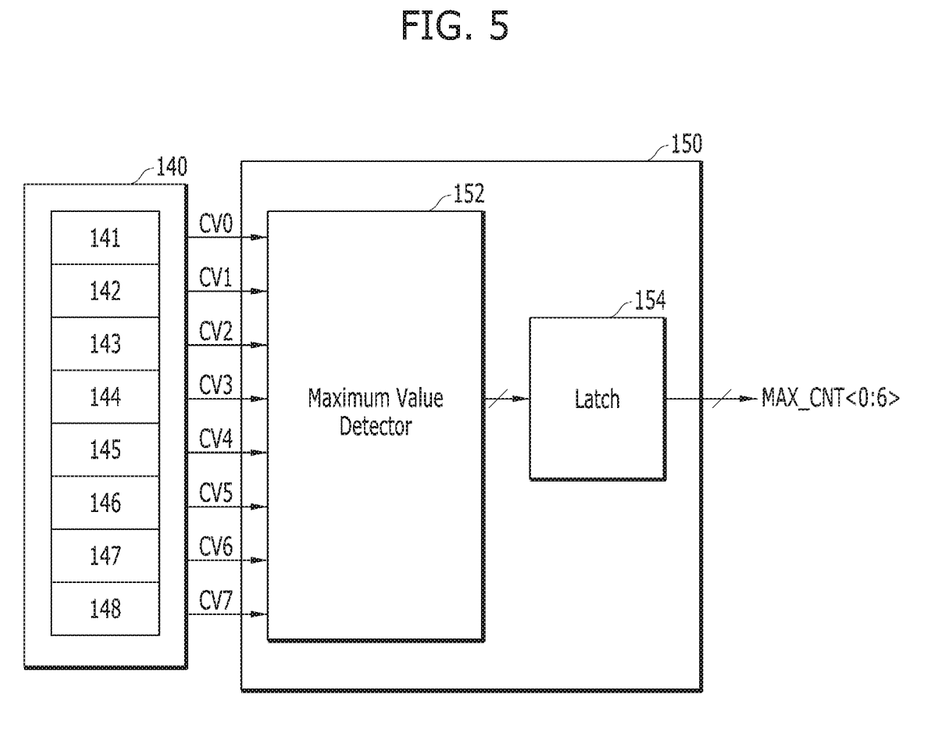
FIG. 5 is a circuit diagram illustrating a counting unit and a counting detection unit that are shown in FIG. 1.

FIG. 5 is a circuit diagram illustrating a counting unit and a counting detection unit in accordance with an embodiment of the present invention, for example, the counting unit 140 and the counting detection unit 150 that are shown in FIG. 1.

Referring to FIG. 5, the counting unit 140 may include first to eighth counters 141 to 148. The first to eighth counters 141 to 148 may count the number of cuts of the enable fuses of the fuse sets in the first to eighth fuse blocks 121 to 128, and generate the first to eighth count values CV0 to CV7. The counting detection unit 150 may detect the maximum value among the first to eighth count values CV0 to CV7 and output the detection signal MAX_CNT<0:6>.

The counting detection unit 150 may include a maximum value detector 152 and a latch 154.

The maximum value detector 152 may detect the maximum value among the first to eighth count values CV0 to CV7. The maximum value detector 152 may detect the maximum value through comparing of the first to eighth count values CV0 to CV7. The maximum value detector 152 may convert the detected maximum value into a 7-bit signal and output it. According to the embodiment of the present invention, the first to eighth counters 141 to 148 may be formed of a 7-bit counter, and output the first to eighth count values CV0 to CV7 of 7 bits, and the maximum value detector 152 may detect the maximum value among the first to eighth count values CV0 to CV7 of 7 bits.

The latch 154 may store the maximum value detected by the maximum value detector 152 as a 7-bit detection signal MAX_CNT<0:6>. The stored detection signal MAX_CNT<0:6> may be applied to the reset signal generation unit 160 of FIG. 1.

Figure 6:
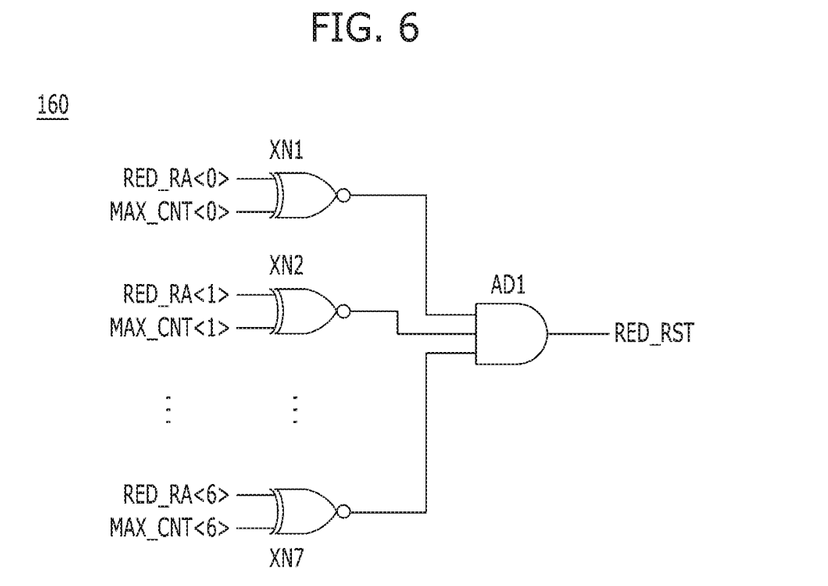
FIG. 6 is a block diagram illustrating a reset signal generation unit shown in FIG. 1.

FIG. 6 is a block diagram illustrating a reset signal generation unit in accordance with an embodiment of the present invention, for example, the reset signal generation unit 160 shown in FIG. 1.

Referring to FIG. 6, the reset signal generation unit 160 may include first to seventh XNOR gates XN1 to XN7 and an AND gate AD1. The first to seventh XNOR gates XN1 to XN7 may receive the bits of the detection signals MAX_CNT<0:6> and the bits of the redundant address RED_RA<0:6> and perform an XNOR operation. The AND gate AD1 may perform an AND operation onto the outputs of the XNOR gates.

With the above-described structure, the reset signal generation unit 160 may activate and output the redundant reset signal RED_RST when the bits of the detection signal MAX_CNT<0:6> coincide with the bits of the redundant address RED_RA<0:6>.

Figure 7:
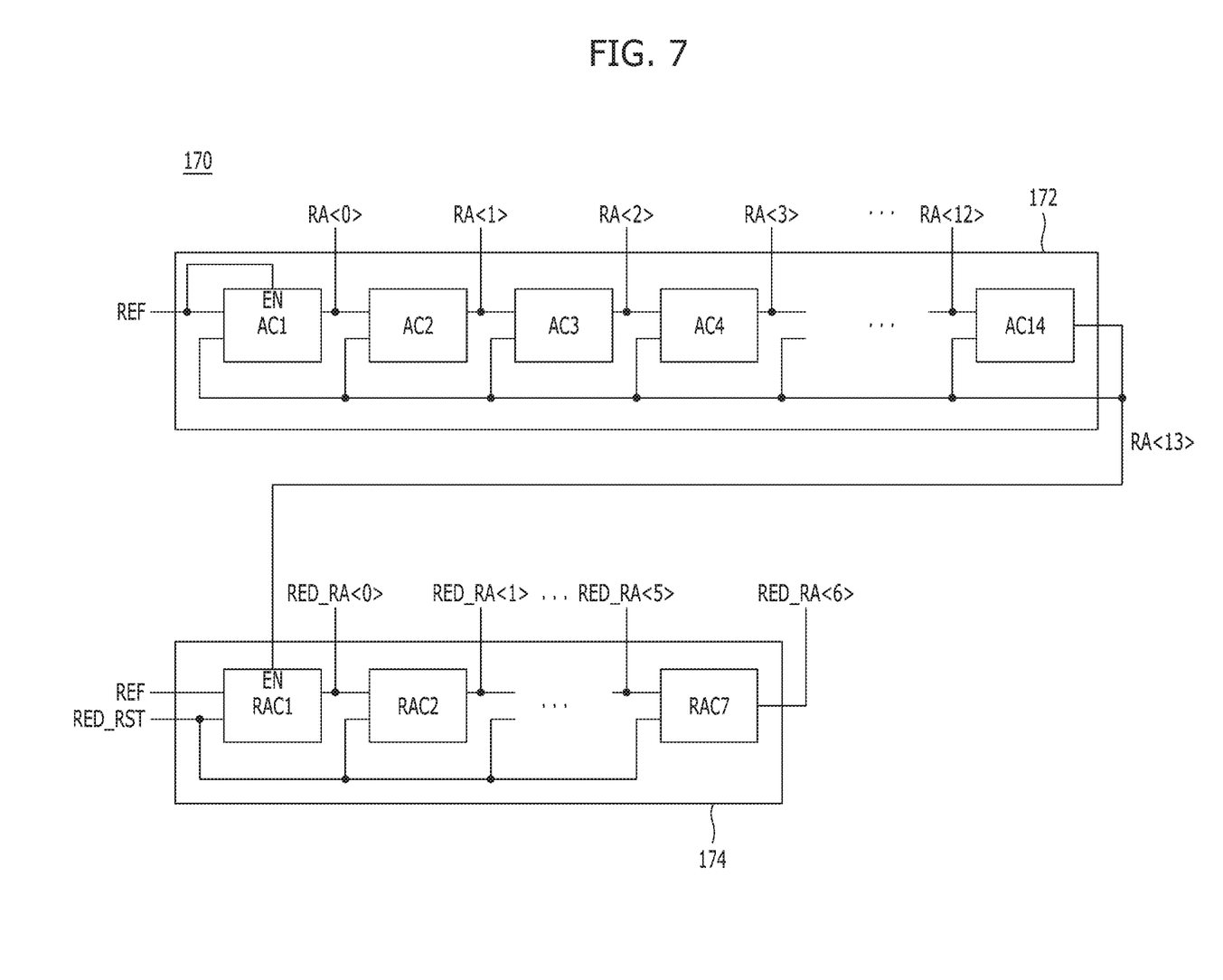
FIG. 7 is a block diagram illustrating an address generation circuit shown in FIG. 1.

FIG. 7 is a block diagram illustrating an address generation circuit in accordance with an embodiment of the present invention, for example, the address generation circuit 170 shown in FIG. 1.

Referring to FIG. 7, the first address generator 172 may include first to 14$^{th}$ normal address counters AC1 to AC14. The address counters AC1 to AC14 may be coupled in series and may correspond to the 14-bit normal address RA<0:13>. The first normal address counter AC1 may be enabled in response to the refresh signal REF to toggle the first bit RA<0> of the normal address RA<0:13> whenever the refresh signal REF is activated. The second normal address counter AC2 may toggle the second bit RA<1> whenever the first bit RA<0> is activated. In this manner, the 14$^{th}$ normal address counter AC14 may toggle the 14$^{th}$ bit RA<13> whenever the 13$^{th}$ bit RA<12> is activated. The first to 14$^{th}$ normal address counters AC1 to AC14 may be initialized in response to the 14$^{th}$ bit RA<13>.

The second address generator 174 may include first to seventh redundant address counters RAC1 to RAC7 that are coupled in series in response to the 7-bit redundant address RED_RA<0:6>. The first redundant address counter RAC1 may be enabled in response to the 14$^{th}$ bit RA<13> and toggle the first bit RED_RA<0> of the redundant address RED_RA<0:6> whenever the refresh signal REF is activated. The second redundant address counter RAC2 may toggle the second bit RED_RA<1> of the redundant address RED_RA<0:6> whenever the first bit RED_RA<O> is activated. In this manner, the seventh redundant address counter RAC7 may toggle the seventh bit RED_RA<6> of the redundant address RED_RA<0:6> whenever the sixth bit RED_RA<5> is activated. The first to seventh redundant address counters RAC1 to RAC7 may be initialized in response to the redundant reset signal RED_RST.

With the above-described structure, the first address generator 172 may count the refresh signal REF to generate 13-bit normal addresses RA<0:12> which sequentially increase, and after the 13-bit normal address RA<0:12> are fully counted, the first address generator 172 may initialize the normal address RA<0:12>. On the other hand, the second address generator 174 may count the refresh signal REF after the 13-bit normal address RA<0:12> is fully counted so as to produce the redundant addresses RED_RA<0:6> that sequentially increase, and initialize the redundant address RED_RA<0:6> in response to the redundant reset signal RED_RST. In other words, a refresh operation for a redundant word line that is not used to repair the repair target word line may be omitted as the redundant address RED_RA<0:6> is initialized based on the redundant reset signal RED_RST before the redundant address RED_RA<0:6> is fully counted.

Hereinafter, a method for refreshing a semiconductor memory device according to an embodiment of the present invention will be described with reference to FIGS. 1 to 8B.

Figure 8A:
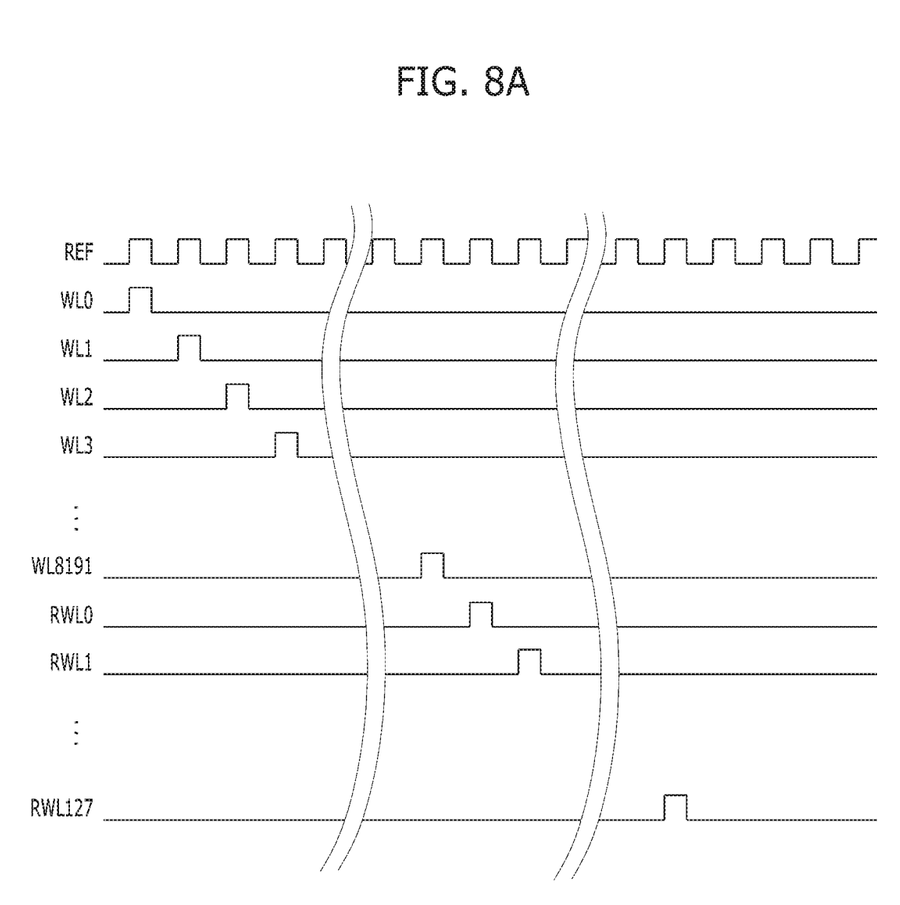
FIG. 8A is a timing diagram describing a refresh operation of a conventional semiconductor memory device.

FIG. 8A is a timing diagram illustrating a refresh operation of a conventional semiconductor memory device.

Referring to FIG. 8A, in the conventional semiconductor memory device, a refresh operation may be sequentially performed onto the 8192 normal word lines WL0 to WL8191 of the normal cell region whenever the refresh signal REF is inputted, and then the refresh operation may be sequentially performed onto the 128 redundant word lines RWL0 to RWL127 of the redundant cell region.

As described above, in the conventional semiconductor memory device, the refresh operation may be sequentially performed onto all the redundant word lines, regardless of whether or not the redundant word line in the redundant cell region is used for repair.

Figure 8B:
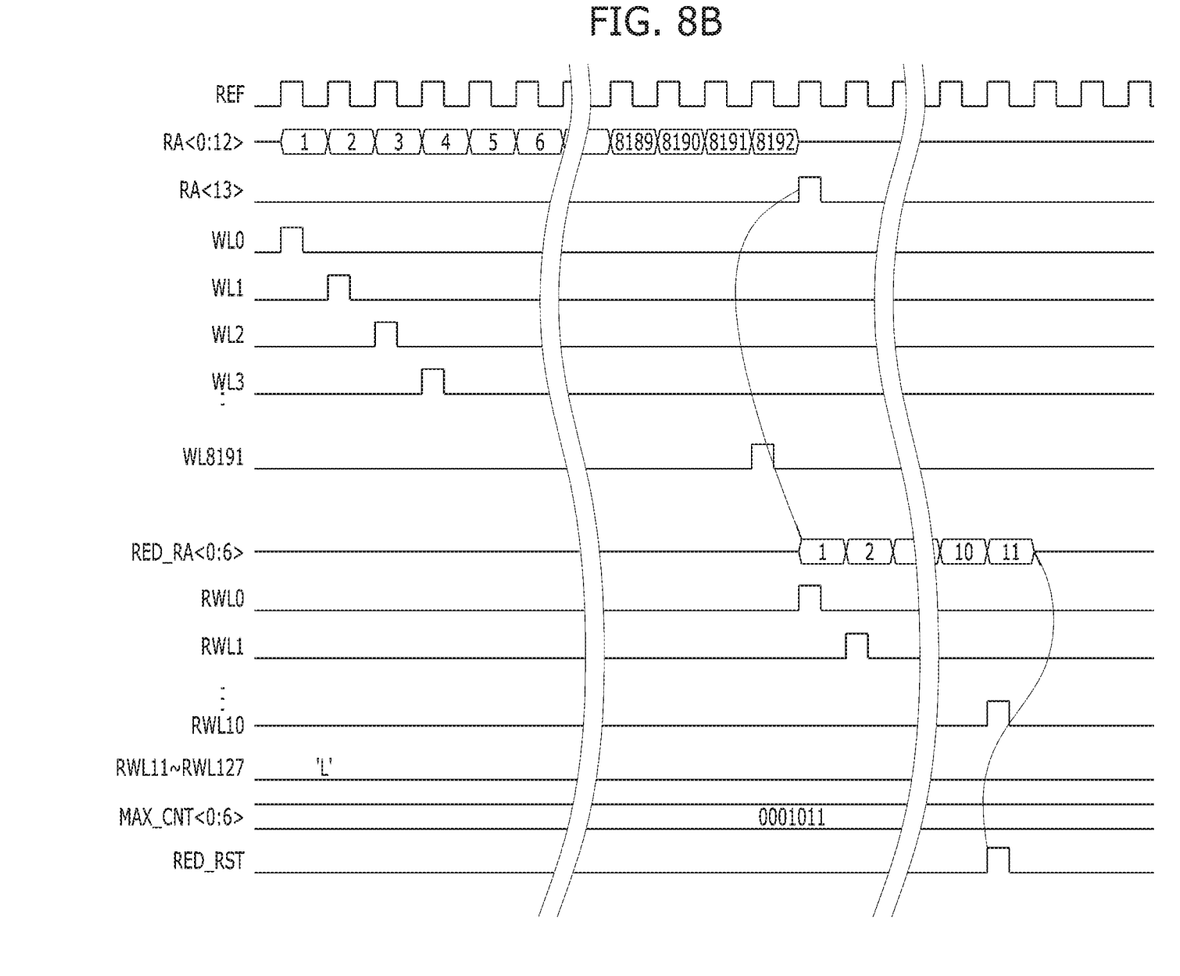
FIG. 8B is a timing diagram describing an operation of a semiconductor memory device in accordance with an embodiment of the present invention.

FIG. 8B is a timing diagram illustrating an operation of a semiconductor memory device in accordance with an embodiment of the present invention. Hereinafter, as shown in FIG. 4, a case where the first to 11$^{th}$ fuse sets FS0 to FS10 which are in use in the eighth fuse block 121 is the maximum value (i.e., 11) will be described as an example.

Referring to FIG. 8B, the first to eighth counters 141 to 148 of FIG. 1 may count the number of fuse sets that are used in the corresponding fuse block, and generate the first to eighth count values CV0 to CV7, respectively. The counting detecting unit 150 may detect the eighth count value CV7 among the first to eighth count values CV0 to CV7 as the maximum value and output the detection signal MAX_CNT<0:6> of '0001011'.

When the refresh signal REF is activated, the first address generator 172 may be enabled in response to the refresh signal REF and count the refresh signal REF to generate 13-bit normal addresses RA<0:12> that sequentially increase. The row decoder 180 may activate the 8192 normal word lines WL0 to WL8191 that are selected by the sequentially increasing normal address RA<0:12> in response to the refresh signal REF and perform a refresh operation.

The 14$^{th}$ bit RA<13> may be activated after the 13-bit normal address RA<0:12> is fully counted, and the first address generator 172 may generate the normal address RA<0:12>. The second address generator 174 may be enabled based on the 14$^{th}$ bit RA<13> to generate redundant address RED_RA<0:6> that sequentially increases by counting the refresh signal REF.

Herein, the reset signal generation unit 160 may activate and output the redundant reset signal RED_RST when the bits of the detection signal MAX_CNT<0:6> coincide with the bits of the redundant address RED_RA<0:6>. In other words, when the redundant address RED_RA<0:6> corresponding to the 11$^{th}$ redundant word line RWL10 is generated, the reset signal generation unit 160 may activate and output the redundant reset signal RED_RST. Thus, the second address generator 174 may initialize the redundant address RED_RA<0:6> without generating an additional redundant address RED_RA<0:6>. The row decoder 180 may activate the first to 11$^{th}$ redundant word lines RWL0 to RWL10 that are selected based on the redundant address RED_RA<0:6> in response to the refresh signal REF and perform the refresh operation, and the row decoder 180 may omit a refresh operation for the 12$^{th}$ to the 127$^{th}$ redundant word lines RWL11 to RWL127.

As described above, the present invention improves the efficiency of a refresh operation by performing the refresh operation only onto redundant word lines used for repairing repair target word lines and omitting the refresh operation for redundant word lines that are not used, when all memory banks are refreshed simultaneously.

According to the embodiments of the present invention, the semiconductor memory device may efficiently perform a refresh operation by omitting a refresh operation onto a redundant word line which is not used for repairing a repair target word line.

While the present invention has been described with respect to specific embodiments, it will be apparent to those skilled in the art that various changes and modifications may be made without departing from the spirit and scope of the invention as defined in the following claims.

For example, a logic gate and a transistor exemplarily described in the embodiments of the present invention described above may be realized to have different positions and kinds according to the polarity of an inputted signal.

What is claimed is:

1. A semiconductor memory device, comprising:
   first to $N^{th}$ memory banks, each including a normal cell region coupled to normal word lines and a redundant cell region coupled to redundant word lines;
   first to $N^{th}$ non-volatile memories that correspond to the first to $N^{th}$ memory banks, respectively, each including a plurality of memory sets for programming repair addresses of the corresponding memory banks;
   a refresh control circuit suitable for generating first to $N^{th}$ count values by counting a number of the memory sets used in the first to $N^{th}$ non-volatile memories, and generating a redundant reset signal based on the first to $N^{th}$ count values; and
   an address generation circuit suitable for generating normal addresses for selecting the normal word lines, which sequentially increase by counting a refresh signal, generating redundant addresses for selecting the redundant word lines by counting the refresh signal after the normal addresses reach a maximum value among the first to $N^{th}$ count values, and initializing the redundant addresses based on the redundant reset signal.

2. The semiconductor memory device of claim 1, wherein the refresh control circuit generates the redundant reset signal based on the maximum value among the first to $N^{th}$ count values.

3. The semiconductor memory device of claim 1, wherein the refresh control circuit includes:
   first to $N^{th}$ counting units that correspond to the first to $N^{th}$ non-volatile memories, respectively, and generate the first to $N^{th}$ count values by counting the number of fuse sets that are used in the corresponding non-volatile memories;
   a counting detection unit suitable for detecting a maximum value among the first to $N^{th}$ count values and outputting a detection signal; and
   a reset signal generation unit suitable for generating the redundant reset signal based on the detection signal and the redundant addresses.

4. The semiconductor memory device of claim 3, wherein each of the memory sets includes:
   an enable fuse suitable for programming information on whether a corresponding memory set is programmed with a valid repair address or not; and
   a plurality of address fuses suitable for programming each bit of the repair addresses.

5. The semiconductor memory device of claim 4, wherein each of the first to $N^{th}$ counting units generates the first to $N^{th}$ count values by counting the number of programmed enable fuses of each of the memory sets in a corresponding non-volatile memory.

6. The semiconductor memory device of claim 3, wherein the counting detection unit includes:
   a maximum value detector suitable for detecting the maximum value by comparing the first to $N^{th}$ count values; and
   a latch suitable for storing the detected maximum value as the detection signal.

7. The semiconductor memory device of claim 1, wherein the reset signal generation unit includes:
   a plurality of first logic gates suitable for receiving bits of the detection signal and bits of each of the redundant address and performing an XNOR operation; and
   a second logic gate suitable for performing an AND operation onto outputs of the first logic gates.

8. The semiconductor memory device of claim 1, wherein the address generation circuit includes:
   a first address generator suitable for generating the normal addresses that sequentially increase by counting the refresh signal; and
   a second address generator suitable for generating the redundant addresses by counting the refresh signal after the normal addresses reach a maximum value and initializing the redundant addresses in response to the redundant reset signal.

9. The semiconductor memory device of claim 1, wherein each of the first to $N^{th}$ non-volatile memories includes one selected from a group including an array e-fuse circuit, a NAND flash memory, a NOR flash memory, an Erasable and Programmable Read Only Memory (EPROM), an Electrically Erasable and Programmable Read Only Memory (EEPROM), a Ferroelectric Random Access Memory (FRAM), and a Magnetic Random Access Memory (MRAM).

10. A refresh control circuit, comprising:
    a plurality of fuse circuits each including a plurality of fuse sets for programming repair addresses of a corresponding memory bank among a plurality of memory banks;
    a plurality of counting units suitable for generating a plurality of count values by counting the number of fuse sets that are used in each fuse circuit;
    a counting detection unit suitable for detecting a maximum value among the count values and outputting a detection signal;
    an address generation circuit suitable for sequentially generating redundant addresses for selecting redundant word lines based on a refresh signal, and initializing the redundant addresses based on a redundant reset signal; and
    a reset signal generation unit suitable for generating the redundant reset signal based on the detection signal and the redundant address.

11. The refresh control circuit of claim 10, wherein each of the fuse sets includes:
    an enable fuse suitable for programming information on whether a corresponding fuse set is programmed with a valid repair address or not; and
    a plurality of address fuses suitable for programming each bit of the repair addresses.

12. The refresh control circuit of claim 11, wherein each of the counting units generates a corresponding count value by counting the number of programmed enable fuses of the fuse sets in a corresponding fuse circuit.

13. The refresh control circuit of claim 10, wherein the counting detection unit includes:

a maximum value detector suitable for detecting the maximum value by comparing the count values; and a latch suitable for storing the detected maximum value as the detection signal.

14. The refresh control circuit of claim 10, wherein the address generation circuit generates the redundant addresses by counting the refresh signal and is initialized in response to the redundant reset signal.

15. The refresh control circuit of claim 10, wherein the reset signal generation unit includes:

a plurality of first logic gates suitable for receiving bits of the detection signal and bits of each of the redundant addresses and performing an XNOR operation; and a second logic gate suitable for performing an AND operation onto outputs of the first logic gates.

16. A method for refreshing a semiconductor memory device, comprising:

providing first to $N^{th}$ memory banks and first to $N^{th}$ non-volatile memories each including a plurality of memory sets for programming repair addresses of the corresponding memory banks;

generating first to $N^{th}$ count values by counting a number of the memory sets used in the first to $N^{th}$ non-volatile memories;

generating a redundant reset signal based on a maximum value among the first to $N^{th}$ count values;

generating normal addresses for selecting normal word lines, which sequentially increase by counting a refresh signal; and generating redundant addresses for selecting redundant word lines by counting the refresh signal after the normal addresses reach the maximum value based on a refresh signal, and initializing the redundant addresses based on the redundant reset signal.

17. The method of claim 16, wherein each of the memory sets includes an enable fuse suitable for programming information on whether a corresponding memory set is programmed with a valid repair address or not; and a plurality of address fuses suitable for programming each bit of the repair addresses, and wherein the generating of the first to $N^{th}$ count values includes:

counting the number of programmed enable fuses of the memory sets in a corresponding non-volatile memory; and generating the plurality of count values based on the counting results for the number of programmed enable fuses of the number of memory sets.

18. A semiconductor memory device, comprising:

a plurality of memory banks, each including a normal cell region coupled to normal word lines and a redundant cell region coupled to redundant word lines;

a plurality of non-volatile memories, each of the plurality of non-volatile memory corresponding to each of the plurality of memory banks and including a plurality of repair addresses for the redundant cell region;

a refresh control circuit suitable for generating a redundant reset signal by counting a number of the repair address; and a refresh circuit suitable for generating normal addresses for selecting the normal word lines, which sequentially increase by counting a refresh signal, generating redundant addresses for selecting the redundant word lines by counting the refresh signal after the normal addresses reach the maximum value, and initializing the redundant addresses based on the redundant reset signal.

* * * * *